(12) United States Patent
Schweiberger (10) Patent No.: US 11,522,522 B2
(45) Date of Patent: Dec. 6, 2022

(54) LOW-PASS FILTER

(71) Applicant: TDK Electronics AG, Munich (DE)

(72) Inventor: Peter Schweiberger, Nattheim (DE)

(73) Assignee: TDK ELECTRONICS AG, Munich (DE)

( * ) Notice: Subject to any disclaimer, the term of this patent is extended or adjusted under 35 U.S.C. 154(b) by 45 days.

(21) Appl. No.: 17/007,745

(22) Filed: Aug. 31, 2020

(65) Prior Publication Data

US 2021/0067142 A1 Mar. 4, 2021

(30) Foreign Application Priority Data

Sep. 2, 2019 (DE) .......................... 102019123457.3

(51) Int. Cl.
| | | |
|---|---|---|
| *H03H 11/00* | (2006.01) | |
| *H03H 11/04* | (2006.01) | |
| *H05K 9/00* | (2006.01) | |
| *H01F 27/06* | (2006.01) | |

(52) U.S. Cl.
CPC ......... *H03H 11/0405* (2013.01); *H01F 27/06* (2013.01); *H05K 9/0001* (2013.01)

(58) Field of Classification Search
CPC ..... H03H 11/0405; H01F 27/06; H03K 9/001
See application file for complete search history.

(56) References Cited

U.S. PATENT DOCUMENTS

| 10,483,935 | B2 | 11/2019 | Dalessandro et al. | |
|---|---|---|---|---|
| 2005/0156702 | A1* | 7/2005 | Marshall ................ | H02K 99/00 336/214 |

FOREIGN PATENT DOCUMENTS

| CN | 105699737 | A | * | 6/2016 |
|---|---|---|---|---|
| DE | 7337626 | U | | 4/1974 |
| DE | 4311124 | A1 | | 10/1994 |
| DE | 102008039983 | A1 | | 3/2010 |
| DE | 202016102587 | U1 | | 6/2016 |
| DE | 102018100047 | | * | 7/2018 |
| EP | 0682395 | | * | 11/1995 |
| EP | 3330981 | A1 | | 6/2018 |

* cited by examiner

*Primary Examiner* — Dinh T Le
(74) *Attorney, Agent, or Firm* — Slater Matsil, LLP (57) ABSTRACT

A low pass filter is disclosed. In an embodiment a low-pass filter includes a current-compensated choke, a reference potential and a capacitor connected in parallel with the current-compensated choke and to the reference potential, wherein a core of the current-compensated choke is configured to have a magnetic circuit, and wherein the core has an air gap.

16 Claims, 6 Drawing Sheets

LOW-PASS FILTER

CROSS-REFERENCE TO RELATED APPLICATIONS

This application claims priority to German Patent Application No. 102019123457.3, filed on Sep. 2, 2019, which application is hereby incorporated herein by reference.

TECHNICAL FIELD

The present invention relates to a low-pass filter. The invention also relates to an arrangement comprising the low-pass filter.

BACKGROUND

An EMC filter is required to reduce noise and other interference below the permissible limiting values of the guidelines which relate to electromagnetic compatibility. Since the interference usually comprises transient or high-frequency components of the current in the lines on which interference suppression is to be performed, low-pass filters are used in the EMC filter in order to filter out these components.

Chokes, that is to say coils or inductors, which have a frequency-dependent inductive resistance with which undesired high-frequency components and interference can be filtered out are used in the low-pass filters. There are basically two different approaches to implementing the chokes for a low-pass filter.

On the one hand, there are current-compensated chokes. These have a closed toroidal core onto which at least two identical coils are wound. The coils are connected in such a way that the magnetic fluxes of the coils in the core compensate one another and the inductance and the resistance of the choke for a symmetrical current are virtually zero. The inductance therefore acts only on an asymmetrical component of the current in the coils. A current-compensated choke has the disadvantage that if the sum of the currents is not equal to zero, a magnetic flux, which is generated by the differential current and which can easily drive the core into saturation, flows in the core. If a difference in current is present in the coils, the filter effect is therefore greatly reduced or is lost completely.

On the other hand, instead of a current-compensated chokes a plurality of single chokes can be used in the filters. Each current line has a separate core which is usually also a toroidal core. The core in single chokes can be configured not to go into saturation within the specified ranges of applications so that the filter effects of the single chokes are not adversely affected. However, if single chokes are used in a filter, a separate core has to be used for each current line. This raises the production costs and makes the filter larger in size.

SUMMARY

Embodiments to provide an improved low-pass filter.

A low-pass filter is described which has a current-compensated choke and a capacitor, wherein the capacitor is connected in parallel with the current-compensated choke and is connected to a reference potential. In addition, a core of the current-compensated choke is configured to have a magnetic circuit, wherein the core has an air gap.

A core can have a magnetic circuit if it provides a closed path for the magnetic flux flowing in the core. In the simplest case, the core is circular, but oval, square or rectangular shapes can also contain a magnetic circuit.

The air gap denotes here not only a gap between two opposite end faces of the core, which gap is filled with air, but also on the contrary can be filled with a multiplicity of materials which are not ferromagnetic and which have a low magnetic permeability. Such materials may be, for example, a non-magnetic metal such as copper, aluminium or lead, a plastic or wood or paper.

The inductance is reduced depending on the design of the air gap, which can also be considered to be a magnetic resistance in the core. However, at the same time magnetic saturation only occurs when there are relatively high magnetic field strengths. This is because excess energy in the form of a magnetic field can be stored in the air gap, which has low magnetic permeability.

Discharging currents, protection conductor currents, fault currents and touch currents can arise in a wide variety of electrical components and can add together to form a differential current. If a differential current occurs between the coils in a current-compensated choke with an air gap, this does not bring about saturation in the core. The difference in energy is instead stored as a magnetic field in the air gap so that the core remains free of saturation. In this way, the filter function of the current-compensated choke is not disrupted, even when there are differential currents between the coils. A low-pass filter which uses a current-compensated choke with an air gap can therefore reliably remove transient interference and high-frequency noise from the line on which interference suppression is to be performed, even when there are relatively high differential currents in the coils.

Therefore, the low-pass filter which has a current-compensated choke with an air gap has, in comparison with low-pass filters with single chokes, a smaller overall size and is cost effective to manufacture, since it is possible to use just one inductor for all the lines. In addition, the filter performance of a low-pass filter according to embodiments is, in contrast with a customary current-compensated choke tolerant with respect to differential currents so that its filter performance is maintained despite differential currents in the coils.

The air gap can be filled with a non-magnetic material. The magnetic permeability of the material in the air gap influences the magnetic energy which can be stored in the air gap of the current-compensated choke. The lower the magnetic permeability, the greater the amount of energy which can be stored. Therefore, paramagnetic materials, which have a magnetic permeability of somewhat greater than 1, are suitable as the material for filling the air gap. Diamagnetic materials are particularly preferred as a filler material for the air gap since they have a magnetic permeability of less than 1 and can therefore compensate a particularly large amount of differential energy in the air gap.

A width of the air gap may be less than 1 mm. In one advantageous embodiment, the air gap can have a width of more than 0.01 mm and of less than 0.5 mm. On the one hand, the differential energy which the air gap can compensate is linearly dependent on the volume of the air gap. The greater the volume, and therefore the width of the air gap, assuming a continuous base surface, the greater the amount of differential energy which the air gap of the current-compensated choke can accommodate. On the other hand, depending on its width, the air gap weakens the inductance of the current-compensated choke so that the filter function can be reduced. Hence, the inductance of a current-compensated choke without an air gap can be, for example, 1000 mH, while with an air gap it can be 800 mH. A width of the air gap which is less than 1 mm hardly restricts the filter function of the current-compensated choke at all.

In addition, the core can have at least one further air gap. Differential energy can also be stored in the further air gaps and therefore the tolerance of the current-compensated choke with respect to differential currents between the coils can be increased. Furthermore, further air gaps can make it easier to configure the core symmetrically.

The core can be composed of a magnetic material. Manufacturing the core from magnetic, preferably from a ferromagnetic material, ensures that the current-compensated choke has a high inductance and therefore a good filter function of the current-compensated choke is provided. Furthermore, the core can also be a powder core. Powder cores which are pressed from a ferromagnetic powder have a distributed air gap which is produced by insulating the individual magnetic particles from one another by means of a binding agent. The distributed air gap can amplify the effect of the air gap in the current-compensated choke, so that a powder core with air gap can compensate additional differential energy.

Furthermore, the capacitor can be a feedthrough capacitor. Feedthrough capacitors are very well suited for a low-pass filter, since they can allow high-frequency and transient currents to flow away to earth with little resistance because of their low impedance. Thanks to their design, in which a housing is frequently part of the opposite electrode of the feedthrough capacitor, they can easily be integrated into an electrical component which has a housing.

The current-compensated choke can have two coils. The current in the two coils can be the same, apart from the discharging currents and fault currents. In this way, when the differences between the currents are small, the core of the choke does not become saturated and the filter function of the choke is maintained.

In addition, the current-compensated choke can have four coils. Owing to the air gap, differential currents can be compensated in the coils so that the core of the choke does not go into saturation as a result of a magnetic flux. The coils can have the same number or a different number of windings and the same current or a different current. In order to avoid adversely affecting the filter function of the choke, the sum of the magnetic fluxes which are generated by the coils should be virtually zero. If four coils are used, the power supply and the power discharge means can each be divided between the two parallel coils. In this way, the current which is fed through, and therefore also the power which is fed through the current-compensated choke, can be increased.

Moreover, the current-compensated choke can be cooled. If the current-compensated choke is cooled with water cooling or air cooling, it can provide a better performance without its filter function being reduced. A heating function of the core and of the coils brings about a lower inductance and therefore lower inductive coupling between the coils. Cooling can be implemented in a very simple way, for example via a fan in the housing which ensures a continuous flow of air at the choke.

The coils can be arranged in an uninterrupted portion of the core. This prevents the inductive coupling between the coils, and therefore the filter function, from being reduced by an air gap. It may also often be advantageous, solely owing to the geometric design of the low-pass filter, to arrange the coils on an arm of the core, since this is, for example, easier to achieve. In this case, the arm of the core on which the coils are arranged should not have any air gaps.

In one embodiment, the core of the current-compensated choke can be a tape wound cut core. Tape wound cut cores are magnetic cores which are constructed from individual components and are held together by a tape. Making an air gap in a tape wound cut core is particularly easy, since all that is required is to arrange a spacer element between two parts of the tape wound cut core.

In addition, an electromagnetically shielded space can have a low-pass filter according to embodiments and a power supply and a power discharge means. The power supply or power discharge means can feed a signal or a current into the space or discharge it therefrom and the signal or the current can be filtered by the low-pass filter. Spacers are frequently shielded electromagnetically in order to make them tap-proof or because measurements relating to electromagnetic compatibility are carried out in these spaces. In particular in spaces in which measurements relating to the electromagnetic compatibility are carried out, it is possible for high discharge currents and fault currents to flow away, as a result of which a conventional filter with a customary current-compensated choke does not provide the required filter performance. If a low-pass filter according to embodiments is used, current differences of 20% between the coils can be compensated by the air gap, so that the filter performance of the low-pass filter is maintained.

In one advantageous arrangement, at least two low-pass filters according to embodiments can be connected in series. If high-frequency or transient interference or noise partially passes through the first low-pass filter, said interference or noise is additionally damped by the downstream low-pass filter. Therefore, an arrangement with a plurality of low-pass filters one behind the other can add together the filter performance and therefore bring about stronger damping.

An arrangement with a plurality of low-pass filters according to embodiments, which are connected in series behind one another, can also be integrated into an electromagnetically shielded space, in order to filter the power supply and power discharge means. In this way, the filter performance of the arrangement is increased over that of an individual filter, and undesired interference and noise on the power supply and power discharge means are damped to a greater extent.

BRIEF DESCRIPTION OF THE DRAWINGS

The invention will be explained in more detail below on the basis of exemplary embodiments and of associated figures.

The drawings described below are not to be considered as being true to scale.

Instead, for the sake of better illustration individual dimensions can be increased, reduced or even distorted.

Elements which are similar to one another or which perform the same function are denoted by the same reference symbols.

DETAILED DESCRIPTION OF ILLUSTRATIVE EMBODIMENTS

Figure 1:
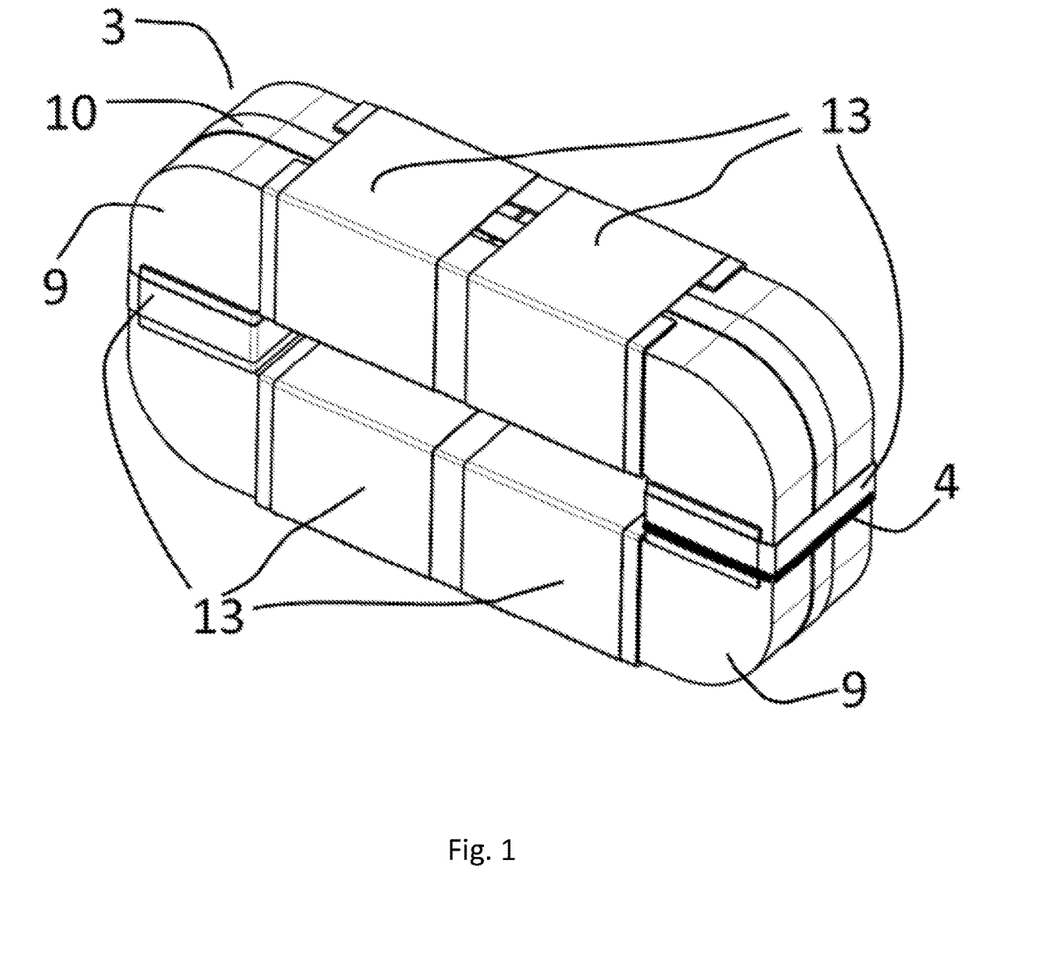
FIG. 1 shows a perspective view of a core of a current-compensated choke which is arranged in a low-pass filter.

FIG. 1 shows a perspective view of a core 3 of a current-compensated choke 2 which is arranged in a low-pass filter 1. The core 3 is a tape wound cut core 3 which has been composed of two parts 9 and is held together by a tape 10. In the embodiment shown, the core 3 is a rectangle with rounded corners. Other shapes which permit a closed magnetic circuit, such as for example a circular shape, an oval shape or a square shape, are also possible. Insulating foils 13, which provide protection and insulate the core electrically, are wound around the parts 9. In a short side view of the tape wound cut core 3, an air gap 4 was generated between the two parts 9 by introducing a spacer element. A spacer element can be any desired object which is used to space apart the surfaces of the core 3 which bound the air gap, i.e. the spacer element can be an object which holds the two adjacent parts 9 of the core at a minimum distance from one another.

Energy in the form of a magnetic field can be stored in the air gap 4 of the core 3. If such a core 3 is integrated into a current-compensated choke 2, a differential current between coils 6, which is produced by discharge currents, protection conductor currents, fault currents and touch currents, can be compensated in the air gap 4. For this reason, a differential current in a current-compensated choke 2, which has a core 3 with an air gap 4, in contrast to conventional current-compensated chokes 2, does not lead to saturation in the core 3. Therefore, the filter performance of a low-pass filter 1 which uses such a current-compensated choke 2 is maintained even when there are differences in current between the coils 6.

The parts 9 of the core 3 have been produced from a magnetic material. For the magnetic coupling between the coils 6 in the current-compensated choke 2 it is important that the core 3 be composed of a good magnetic conductor. This ensures that the current-compensated choke 2 has high inductance, and a low-pass filter 1 into which the current-compensated choke 2 is integrated has an excellent filter function. The core 3 can preferably be composed of a ferromagnetic material, based on Fe, Co, Ni and on an alloy made of these elements. In a further embodiment, the coil 3 can be a powder core which is pressed from a ferromagnetic powder. As a result of occlusions in the material, powder cores have a distributed air gap which can amplify the effect of the air gap 4 in the current-compensated choke 2.

The air gap 4 in FIG. 1 is filled with a non-magnetic material and therefore forms a magnetic resistance in the magnetic circuit. However, it can, for example, be filled with air or also with another non-magnetic material. Depending on the material used, different amounts of energy in the form of a magnetic field can be stored and/or compensated in the air gap 4. Lower magnetic permeability of the material in the air gap 4 gives rise to a relatively large quantity of energy which can be stored. For this reason, paramagnetic and diamagnetic materials, which each have a magnetic permeability of somewhat more than 1 or less than 1, are highly suitable as a material for the air gap 4.

The air gap 4 in the core 3 which is illustrated in FIG. 1 is approximately 100 μm wide. It can be implemented in a simple embodiment, for example, by a spacer element, a film or by paper. Given a constant base surface of the air gap 4, the volume is determined by the width of the air gap 4, wherein the width corresponds to the distance between the surfaces of the core 3 which bound the air gap 4. Since the volume of the air gap 4 directly influences the energy which can be stored in the air gap 4, with a wider air gap 4 it is possible to compensate a larger differential current between the coils 6 of the current-compensated choke 2. Because the air gap 4 acts as a magnetic resistance, the inductance and the magnetic coupling between the coils 6 of the current-compensated choke 2 are negatively influenced by a wider air gap 4. Accordingly, a width of the air gap 4 which is less than 1 mm is to be preferred, in order to avoid reducing the filter function of the current-compensated choke 2.

Figure 2:
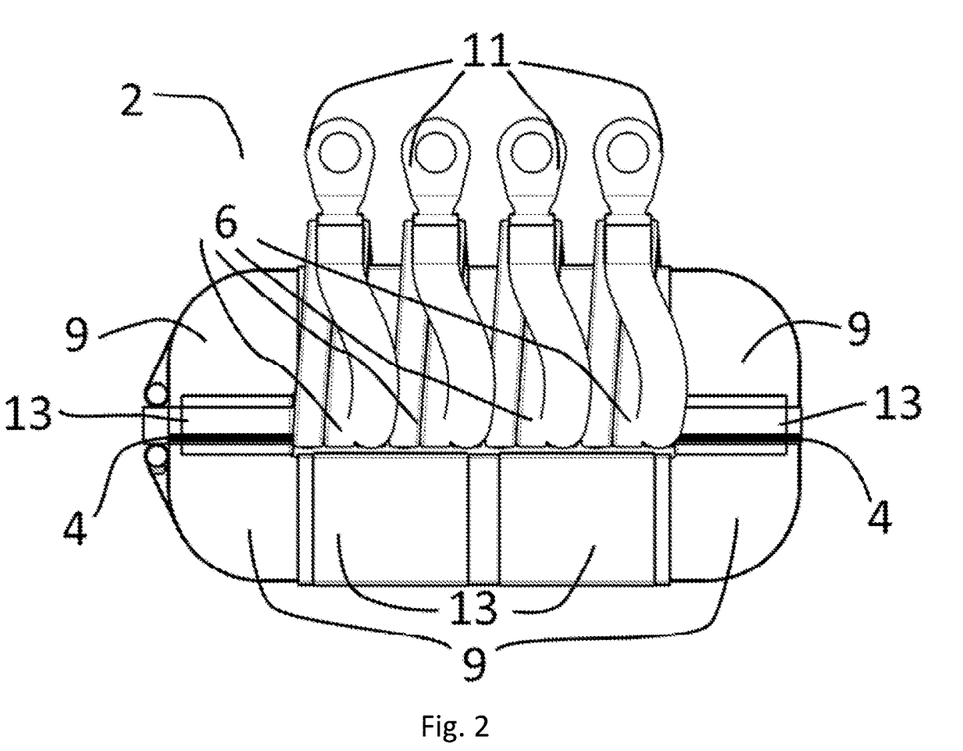
FIG. 2 shows a side view of a current-compensated choke which is arranged in a low-pass filter.

FIG. 2 illustrates a side view of a current-compensated choke 2 which is arranged in a low-pass filter 1. The core 3 is a tape wound cut core 3 and also has, like the tape wound cut core from FIG. 1, two parts 9, from which the tape wound cut core 3 is composed. One tape 10, which is stretched around the core 3 holds the parts 9 together. In the embodiment shown in FIG. 2, the tape wound cut core 3 has two air gaps 4, which are respectively arranged between the two parts 9 on both short sides of the tape wound cut core 3. The formation of a further air gap 4 increases the differential energy which can be taken up by the current-compensated choke 2. With even further air gaps 4, the current-compensated choke 2 could compensate an even greater current difference between the coils 6. Arranging the air gaps 4 symmetrically in the tape wound cut core 3 additionally avoids a situation in which the parts 9 are skewed with respect to one another. The pressure which arises between the surfaces of the parts 9 as a result of the tape 10 is also uniformly distributed by virtue of the symmetrical arrangement.

The current-compensated choke 2 has four coils 6 in the embodiment which is shown in FIG. 2, but can also have just two coils 6 in other embodiments. The coils 6 in FIG. 2 each have two windings, but can have a different number of windings from this and also differing numbers of windings from one another. Each of the coils 6 has two connections in order to feed through a current, wherein the side view in FIG. 2 shows just one connection 11 of each coil 6 in each case. If the core 3 is composed of a conductive material, it is to be ensured that the coils 6 are electrically insulated from the core 3. If four coils 6 are used, the power supply 7 and the power discharge means 8 can be respectively distributed between two coils 6 connected in parallel. In this way, the current which is fed through, and therefore also the power which is fed through the low-pass filters 1 can be increased.

In addition, the windings are all arranged on a longitudinal side of the tape wound cut core 3, which side constitutes an uninterrupted area of the core 3. This arrangement has the advantage that the connections of the coils 6 lie on one side of the core 3 and they can therefore be reached more easily when the core 3 is fitted in a housing 12. In addition, this makes it possible to rule out the possibility of the inductive coupling between the coils 6 being reduced, involving a reduction in the filter function of the current-compensated choke 2.

Figure 3:
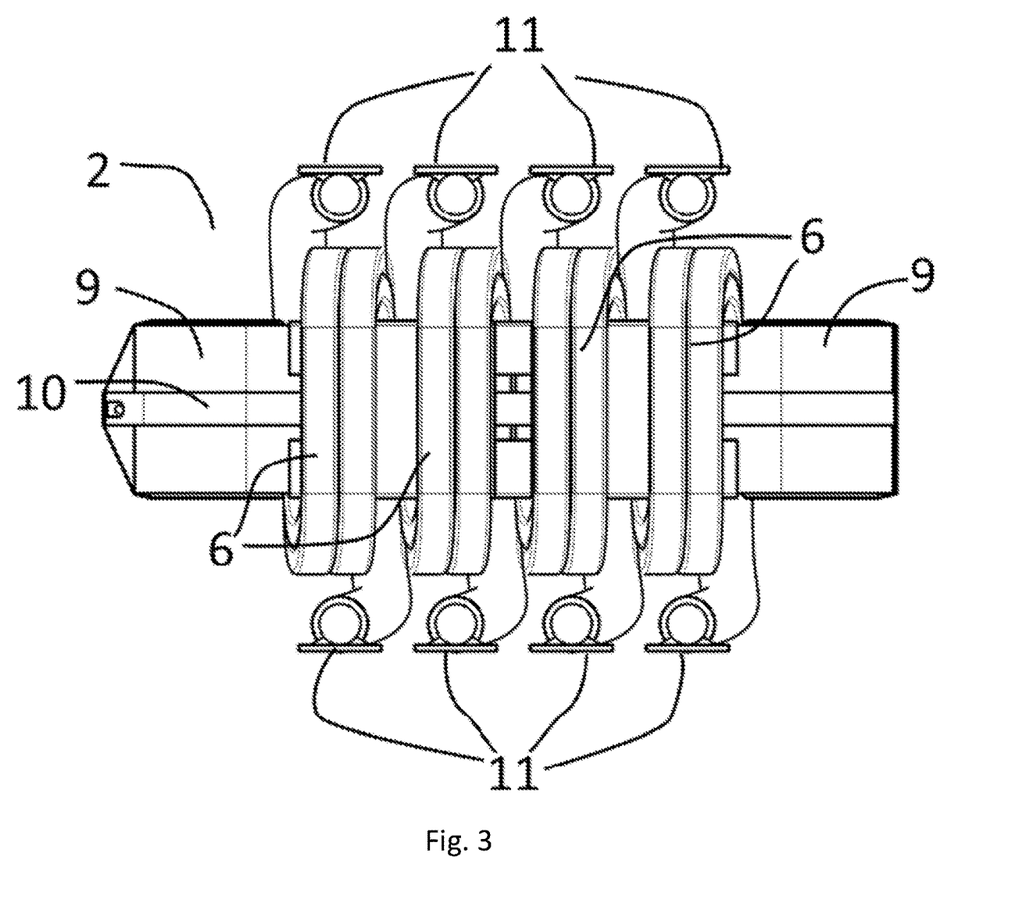
FIG. 3 shows a plan view of a current-compensated choke which is arranged in a low-pass filter.

FIG. 3 shows a plan view of the current-compensated choke 2, which is illustrated in a side view in FIG. 2. From this perspective, the two windings and two connections for each coil 6 can be seen more clearly. The tape 10, which holds together the parts 9 of the tape wound cut core 3, can be seen centrally around the core 3.

Figure 4:
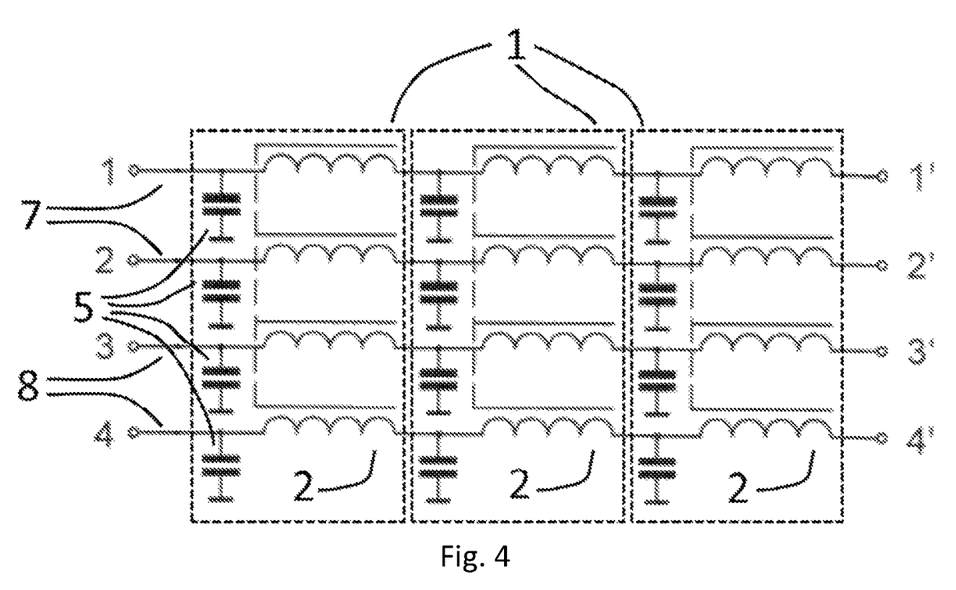
FIG. 4 shows a circuit diagram of three low-pass filters connected in series.

FIG. 4 shows a circuit diagram of three low-pass filters 1 which are connected in series. The four lines, which lead from the input side, on the left of the figure, to the output side, on the right of the figure, are two power supplies 7 and two power discharge means 8, which are associated in pairs. Each individual current-compensated choke 2, associated with the three low-pass filters 1, has four coils 6, which are each connected to a power supply 7 or power discharge means 8. In the illustrated circuit, a capacitor 5 on the input side is connected in parallel with each of the twelve coils 6, wherein the capacitor 5 is connected to a reference potential. The core 3 with air gap 4 is illustrated by the dashed line between the coils 6. Asymmetrical transient interference or high-frequency noise in the power lines experience a large resistance in the current-compensated choke 2 and are conducted into a reference potential via the capacitor 5. An arrangement of a plurality of low-pass filters 1 one behind the other has the advantage that interference which the first low-pass filter 1 has not been able to remove entirely from the line, can be subsequently eliminated by the further downstream low-pass filters 1 which are connected in series.

Figure 5:
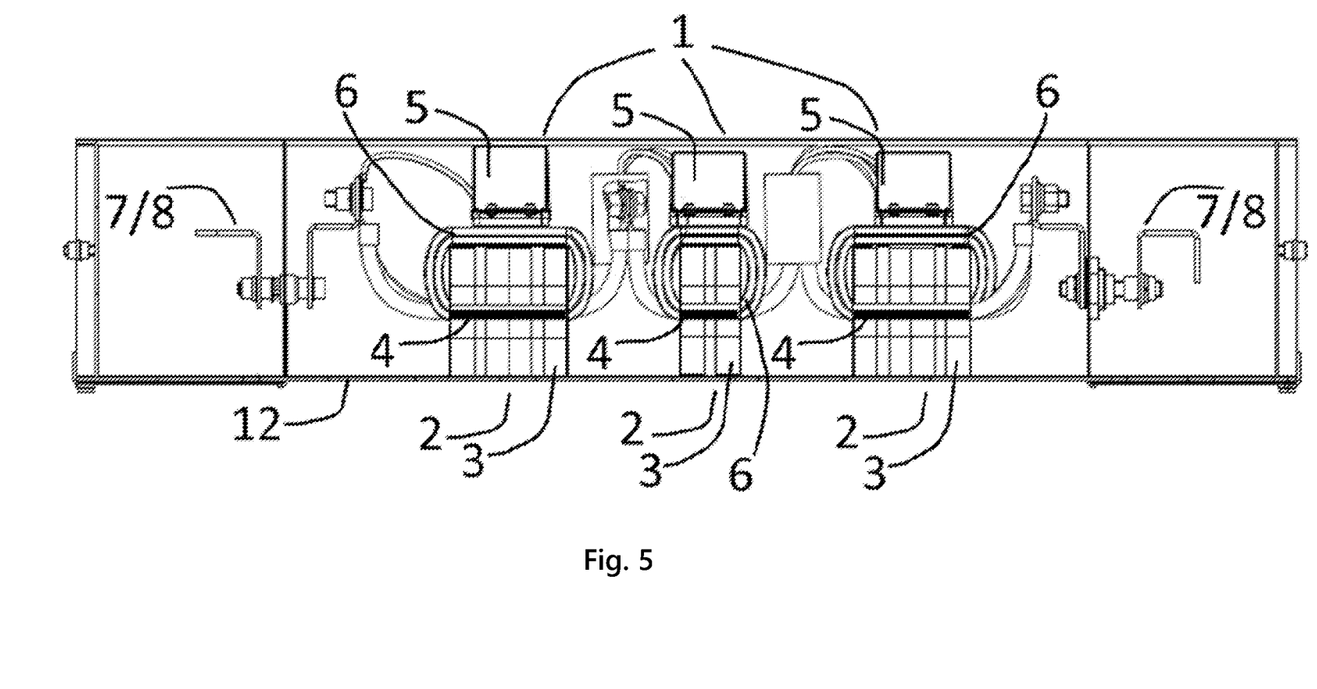
FIG. 5 shows a side view of three low-pass filters, connected in series, in a housing.

FIG. 5 shows a side view of three low-pass filters 1 which are connected in series, in a housing 12. The three low-pass filters 1 are connected to one another, in analogous way to the circuit shown in FIG. 4. The current-compensated chokes 2 are similar to the current-compensated chokes 2 shown in FIGS. 2 and 3. That is to say the current-compensated chokes 2 which are shown also have a tape wound cut core 3, and all four coils 6 are arranged on a longitudinal side of the core 3 in an uninterrupted portion. In this illustration, it can be seen particularly well how the arrangement of the coils 6 on an upper side is advantageous. If the cover is taken off the housing 12, direct access is obtained to the connections of the coils 6 and of the capacitors 5.

While the left-hand and right-hand current-compensated chokes 2 each use two tape wound cut cores 3 one next to the other as a core 3, the middle current-compensated choke 2 merely uses one tape wound cut core 3. Correspondingly, the inductance of the middle current-compensated choke 2 is half as large as the inductance of the two outer current-compensated chokes 2. Since the frequency-dependent resistance of the current-compensated choke 2 is, however, highly dependent on the inductance, different frequency ranges are damped to differing extents at the different current-compensated chokes 2. In particular, at a lower frequency, higher inductance already brings about comparable resistance and damping. Therefore, a frequency-dependent damping behaviour can be modulated by an arrangement of current-compensated chokes 2 with different inductances.

In each case the feedthrough capacitors 5 which are associated with the coils 6 are mounted on the current-compensated choke 2 and connected thereto. In a feedthrough capacitor 5, a housing 12 is frequently part of the opposite electrode, for which reason it is very well suited for the design shown in FIG. 5. Moreover, owing to their low impedance, feedthrough capacitors 5 can pass on high-frequency and transient currents to the reference potential without relevant resistance.

Figure 6:
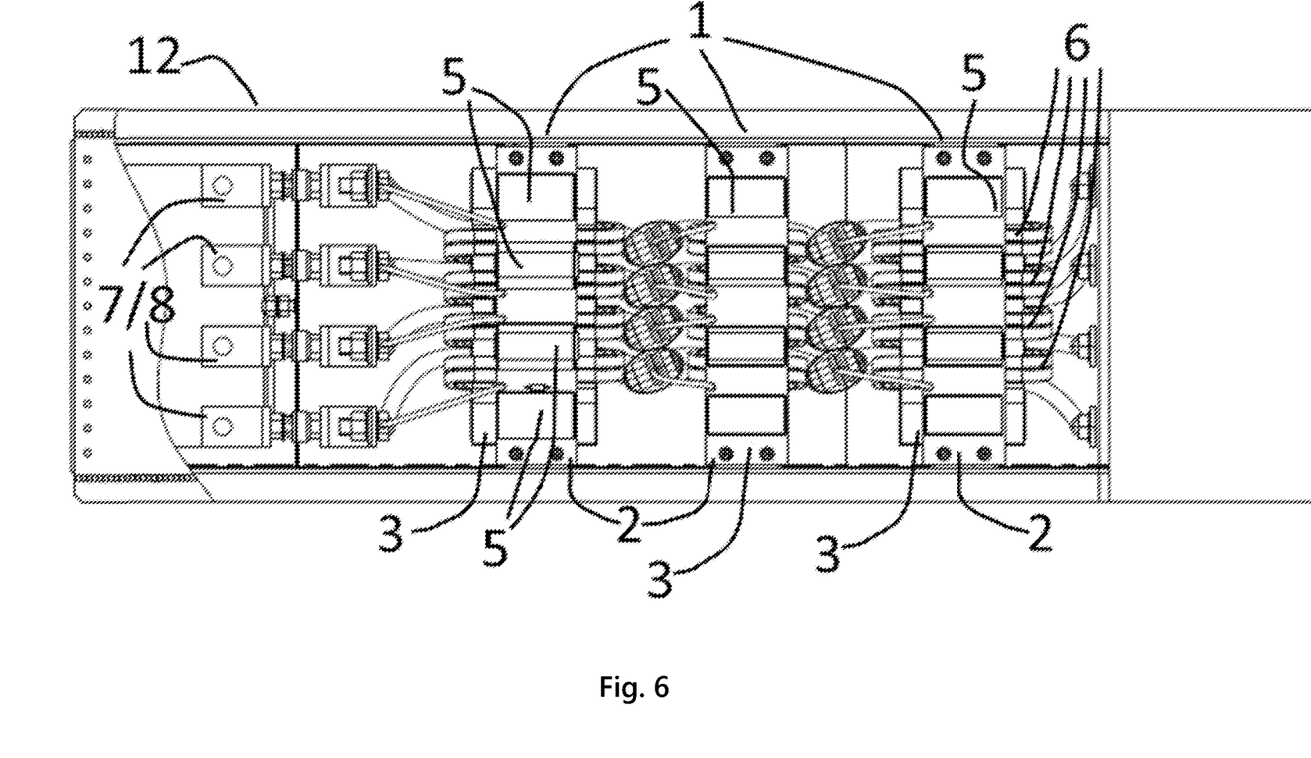
FIG. 6 shows a plan view of three low-pass filters 1, connected in series, in a housing.

FIG. 6 shows a plan view of three low-pass filters 1 which are connected in series in a housing 12, which low-pass filters 1 have also been shown in FIG. 5 in a side view. The four electrical connections for the filter are arranged on the left-input side, said connections respectively associated with two power supplies 7 and power discharge means 8. Each of the four connections is respectively connected via a line to the three current-compensated chokes 2, connected one behind the other in series, of the low-pass filters 1. In each current-compensated choke 2, each power supply 7 and power discharge means 8 has been connected to a coil 6 which has two windings. Each coil 6 of the current-compensated choke 2 has in turn been connected in parallel to a feedthrough capacitor 5, which is mounted on the associated current-compensated choke 2.

Furthermore, for example, a fan for cooling the current-compensated chokes 2 can be provided in the housing 12. In this way, a better performance can be achieved by the low-pass filter 1 without its filter function being reduced. Heating the core 3 and the coils 6 gives rise to a lower inductance of the current-compensated choke 2 and therefore to lower inductive coupling between the coils 6. As an alternative to this, it is also possible to use a different type of cooling, for example water cooling.

The low-pass filter 1 offers the advantage over a low-pass filter 1 with single chokes 2 that it is cost effective to produce, since just one current-compensated choke 2 can be used for all the lines, and in addition it can be made much smaller in overall size. In the exemplary embodiment shown above with three low-pass filters 1 which have been connected one behind the other, only three cores 3 have to be installed, while twelve would have to be used when there is a single choke. Furthermore, the filter performance of a low-pass filter 1 according to embodiments is ten times more tolerant with respect to differential currents in the coils 6 than a customary current-compensated choke 2. The low-pass filter 1 can maintain the filter function despite differential currents in the coils 6.

A low-pass filter 1 is particularly suitable for spaces which are electromagnetically shielded. In particular, high discharge currents and fault currents can occur in spaces which are used for measurements of electromagnetic compatibility. These lead to a situation in which a conventional filter with a customary current-compensated choke 2 no longer provides a filter function, since the core 3 becomes saturated and the inductance of the choke is cancelled out. If, on the other hand, a low-pass filter 1 is used, differences between currents of 20% between the coils 6 can be compensated easily by the air gap 4. The differential currents in the coils 6 do not cause the core 3 to become saturated, as in a conventional current-compensated choke 2. Instead, a magnetic field is built up in the air gap 4, said field taking up the differential energy between the coils 6. In this way, the core 3 itself remains free of saturation effects, and the current-compensated choke 2 can maintain the filter function even when there are high discharge currents. In contrast, in a conventional filter with a current-compensated choke 2 the filter function already fails when there is a current difference of less than 2% between the coils 6, owing to saturation effects in the core 3.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A low-pass filter comprising:
a current-compensated choke comprising a core;
a reference potential; and
a capacitor connected to the reference potential and in parallel with the current-compensated choke,
wherein the core of the current-compensated choke is configured to establish a magnetic circuit, wherein the core has a gap, and wherein a width of the gap is less than 1 mm.

2. The low-pass filter according to claim 1, wherein the gap is filled with a non-magnetic material.

3. The low-pass filter according to claim 1, wherein the core has at least one further gap.

4. The low-pass filter according to claim 1, wherein the core consists essentially of a magnetic material.

5. The low-pass filter according to claim 1, wherein the capacitor is a feedthrough capacitor.

6. The low-pass filter according to claim 1, wherein the current-compensated choke has two coils.

7. The low-pass filter according to claim 1, wherein the current-compensated choke has four coils.

8. The low-pass filter according to claim 6, wherein the coils are arranged in an uninterrupted area of the core.

9. The low-pass filter according to claim 1, further comprising a cooling system configured to cool the current-compensated choke.

10. The low-pass filter according to claim 1, wherein the core of the current-compensated choke is a tape wound cut core.

11. An electromagnetically shielded space comprising:
the low-pass filter according to claim 1;
a power supply; and
a power discharger.

12. An arrangement comprising:
at least two low-pass filters, each of the filters being the low-pass filter according to claim 1,
wherein the low-pass filters are connected in series.

13. An electromagnetically shielded space comprising:
the arrangement according to claim 12.

14. The low-pass filter according to claim 1, wherein the width of the gap is more than 0.01 mm and less than 0.5 mm.

15. The low-pass filter according to claim 9, wherein the cooling system is a water cooling system or an air cooling system.

16. The low-pass filter according to claim 1, wherein the gap is an air gap.

* * * * *